(12) United States Patent
Davis

(10) Patent No.: US 8,544,652 B2
(45) Date of Patent: Oct. 1, 2013

(54) COMPONENT TAPE

(75) Inventor: Peter Davis, Santa Cruz, CA (US)

(73) Assignee: Hover-Davis, Inc., Rochester, NY (US)

( * ) Notice: Subject to any disclaimer, the term of this patent is extended or adjusted under 35 U.S.C. 154(b) by 416 days.

(21) Appl. No.: 11/764,827

(22) Filed: Jun. 19, 2007

(65) Prior Publication Data

US 2008/0314793 A1 Dec. 25, 2008

(51) Int. Cl.
*B65D 85/86* (2006.01)

(52) U.S. Cl.
USPC .............................. 206/714; 414/412; 156/344

(58) Field of Classification Search
USPC ................. 206/320, 713–717; 156/344, 584, 156/943; 414/412
See application file for complete search history.

(56) References Cited

U.S. PATENT DOCUMENTS

| | | | |
|---|---|---|---|
| 4,820,369 A | 4/1989 | Kubo | |
| 5,441,809 A * | 8/1995 | Akhter | 206/714 |
| 6,402,452 B1 | 6/2002 | Miller et al. | |
| 6,404,181 B1 * | 6/2002 | Hikita | 206/714 |
| 6,659,705 B1 | 12/2003 | Reinnagel et al. | |
| 6,869,040 B2 * | 3/2005 | Eskang | 206/714 |
| 2007/0241028 A1 * | 10/2007 | Larsson et al. | 206/714 |

* cited by examiner

*Primary Examiner* — Andrew Perreault
(74) *Attorney, Agent, or Firm* — Schmeiser, Olsen & Watts LLP

(57) ABSTRACT

A component tape comprising a base tape that includes pockets configured to house electrical components for placement on a printed circuit board and a cover tape, covering the base tape wherein a portion of the cover tape is configured to engage with a tape engagement feature of a component tape feeder.

9 Claims, 7 Drawing Sheets

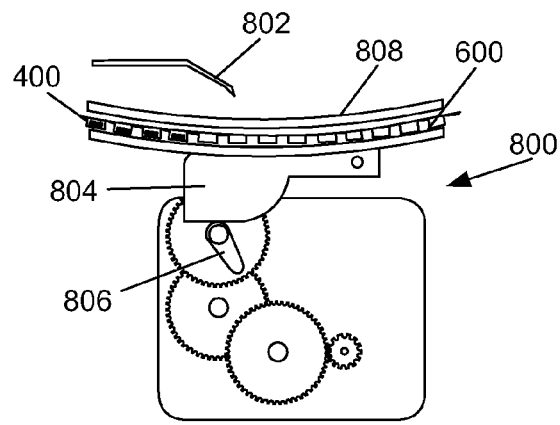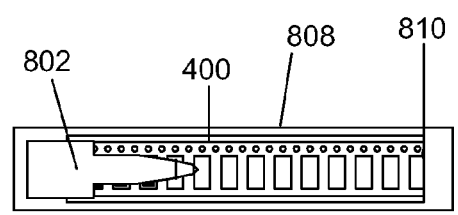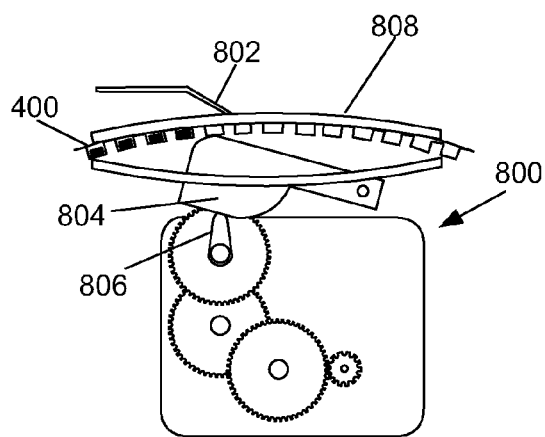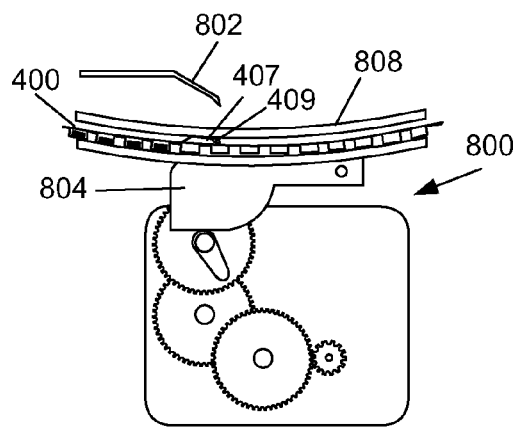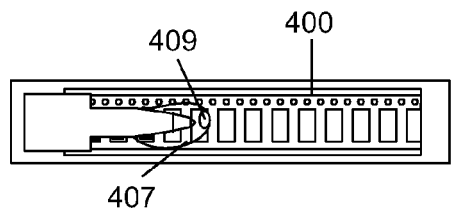
FIG. 21
FIG. 22
FIG. 23
FIG. 24
FIG. 25

COMPONENT TAPE

BACKGROUND OF THE INVENTION

1. Technical Field

This invention relates generally to component tape. More particularly, the present invention relates to component tape for use in feeders which employ a splitter mechanism to aid in the exposure of electronic components housed within for subsequent pick up by a component pick and place machine.

2. Related Art

Electronic devices commonly include printed circuit boards comprising several electronic components. Such electronic components are frequently assembled onto a printed circuit board by a component placement machine. Electronic components to be picked and placed by a component placement machine for assembly onto a printed circuit board are typically supplied via a component tape. The component tape may comprise a base tape, which may further comprise pockets for housing the components, and a cover tape to retain the components within the pockets. The component tape is usually comprised of paper or plastic or a combination thereof, which may be embossed; and, in particular, the plastic may be clear or opaque. Ordinarily, the component tape is wound onto reels which are attached to a feeder which in turn is mounted within a component placement machine. The feeder generally operates by feeding the component tape through a series of mechanisms such that the cover tape is separated from the base tape to expose the component housed within the pocket. One such feeder employed for this purpose uses a tape splitter or other like implement which may engage the cover tape such that the cover tape is lifted away from the base tape. However, since the types and thickness vary from component tape to component tape, a splitter or other like implement may not reliably engage and facilitate removal of the cover tape. For instance, the component tape may pass entirely underneath the tape splitter such that the splitter fails to engage the cover tape with the splitter thereby inhibiting the exposure of the components. Also over time a splitter or other implement may have a build up of glue and/or dust that may contribute to an inability to reliably engage the cover tape. Faulty or inefficient removal of the cover tape may cause the feeder to malfunction and therefore degrade the performance of the component placement machine. Therefore, there exists a need for a component tape with a cover tape which will reliably engage with the splitter.

SUMMARY OF THE INVENTION

A first aspect of the present invention provides a component tape comprising: a base tape, wherein the base tape includes pockets configured to house electrical components for placement on a printed circuit board; and a cover tape, covering the base tape; wherein a manipulated portion of the cover tape is configured to engage with a tape engagement feature of a component tape feeder.

A second aspect of the present invention provides a method of preparing a component tape for engagement with a tape splitter of a feeder, the method comprising: providing a component tape including: a base tape, wherein the base tape includes pockets configured to house electrical components for placement on a printed circuit board; and a cover tape, covering the base tape; manipulating a portion of the cover tape so that the cover tape has structure facilitating engagement of the cover tape with the tape splitter of the feeder.

A third aspect of the present invention provides a method of providing a component tape to feed electronic components, said method comprising: providing a component tape including: a base tape, wherein the base tape includes pockets configured to house electrical components for placement on a printed circuit board; and a cover tape, covering said base tape; manipulating the cover tape, with a pre-splitter module through operation of a pre-splitter, to separate said cover tape from said base tape and form a raised portion, wherein said raised portion is configured to engage an engagement feature of a component tape feeder as the component tape is driven through the component tape feeder.

BRIEF DESCRIPTION OF THE DRAWINGS

Some embodiments of this invention will be described in detail, with reference to the following figures, wherein like designations denote like members, wherein:

FIG. 21 depicts a side view of an embodiment of a component tape before the cover tape encounters an embodiment of a pre-splitter of an embodiment of a pre-splitter module, in accordance with embodiments of the present invention;

FIG. 22 depicts a top view of an embodiment of a component tape before the cover tape encounters an embodiment of a pre-splitter of an embodiment of a pre-splitter module, in accordance with embodiments of the present invention;

FIG. 23 depicts a side view of an embodiment of a component tape as the cover tape encounters an embodiment of a pre-splitter of an embodiment of a pre-splitter module, in accordance with embodiments of the present invention;

FIG. 24 depicts a side view of an embodiment of a component tape after the cover tape encounters an embodiment of a pre-splitter of an embodiment of a pre-splitter module, in accordance with embodiments of the present invention; and FIG. 25 depicts a top view of an embodiment of a component tape after the cover tape encounters an embodiment of a pre-splitter of an embodiment of a pre-splitter module, in accordance with embodiments of the present invention.

DETAILED DESCRIPTION OF THE INVENTION

Figure 1:
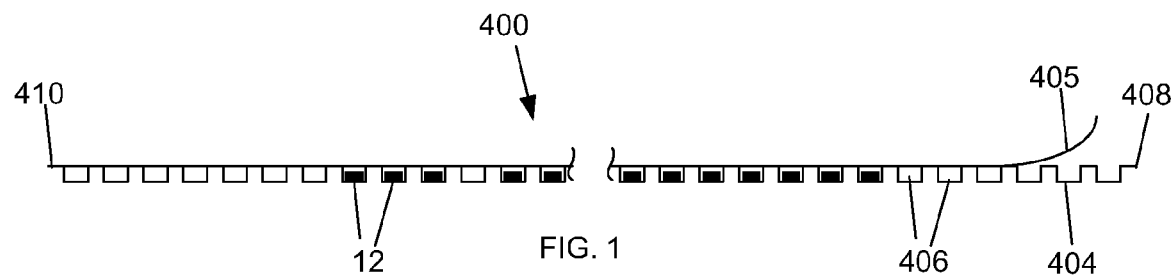
FIG. 1 depicts a side view of an embodiment of a component tape having a portion of a cover tape separated vertically, in accordance with embodiments of the present invention.

Although certain embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc. and are disclosed simply as an example of an embodiment. The features and advantages of the present invention are illustrated in detail in the accompanying drawings, wherein like reference numerals refer to like elements throughout the drawings.

As a preface to the detailed description, it should be noted that, as used in this specification and the appended claims, the singular forms "a", "an" and "the" include plural referents, unless the context clearly dictates otherwise.

Figure 2:
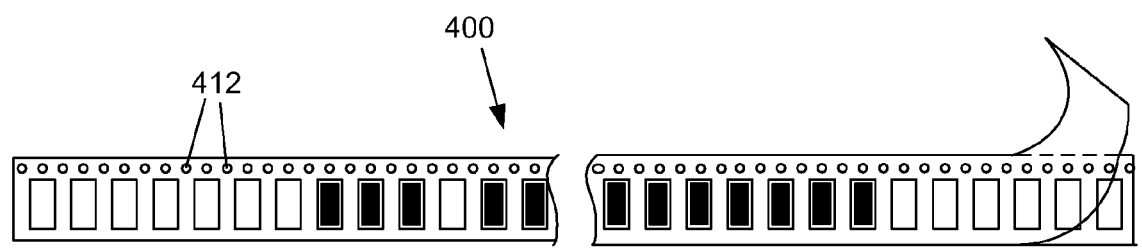
FIG. 2 depicts a top view of an embodiment of the component tape of FIG. 1, in accordance with embodiments of the present invention.

Turning now to the drawings, FIGS. 1-2 depict a side view and top view of an embodiment of a component tape 400. Component tape 400 may comprise a base tape 404, a cover tape 405 (shown peeled away from the base tape 404 for more clear depiction), and a plurality of pockets 406 which may house electronic components 12. Component tape 400 may also include a leading edge 408 and trailing edge 410 as well as holes 412. Holes 412 may be situated either on one or both sides of component tape 400 and may be spaced equally apart. Base tape 404 may be clear or opaque plastic, paper, or blister type. Cover tape 405 is typically formed of clear plastic, but may be formed of other materials in accordance with the present invention.

Figure 3:
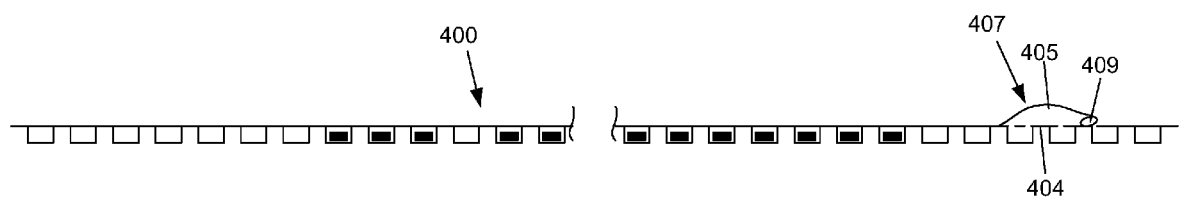
FIG. 3 depicts a side view of an embodiment of a component tape having a manipulated portion of the cover tape, in accordance with embodiments of the present invention.
Figure 4:
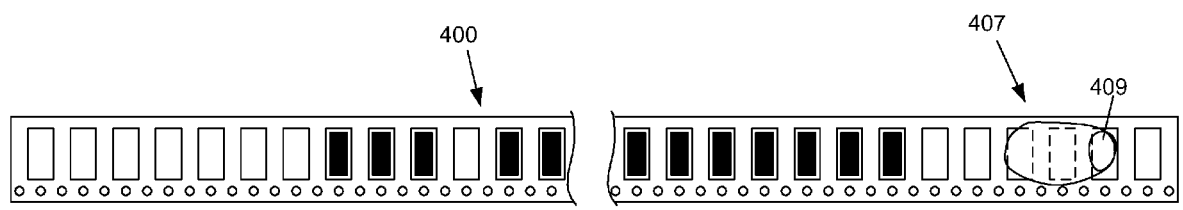
FIG. 4 depicts a top view of an embodiment of the component tape of FIG. 3, in accordance with embodiments of the present invention.
Figure 15:
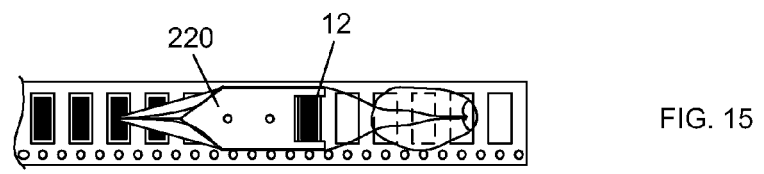
FIG. 15 depicts a top view of an embodiment of a component tape having a manipulated portion of the cover tape reforming after the manipulated portion of the cover tape encounters the tape engagement feature of an embodiment of an exposure module, in accordance with embodiments of the present invention.
Figure 16:
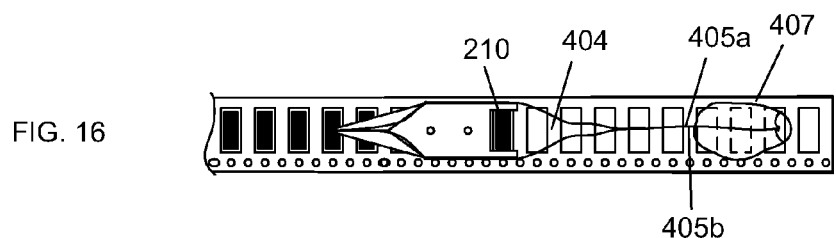
FIG. 16 depicts a top view of an embodiment of a component tape having a manipulated portion of the cover tape reformed following encounter with an embodiment of a tape engagement feature of an embodiment of an exposure module, in accordance with embodiments of the present invention.
Figure 17:
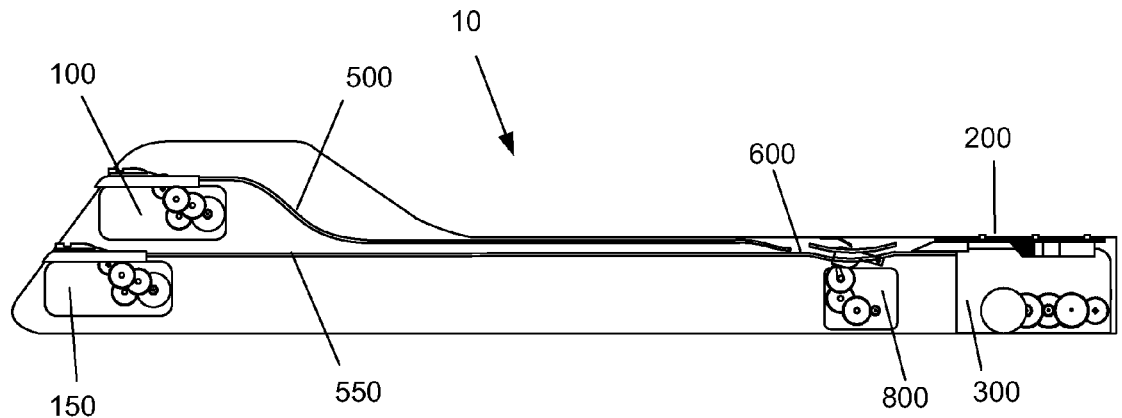
FIG. 17 depicts a side view of an embodiment of a component tape feeder having a cover removed, in accordance with embodiments of the present invention.

In order to help facilitate the efficient provision of electronic components 12 to a pick and place machine (not shown) by a feeder 10 (an embodiment of which is shown in FIG. 17), a component tape 400 may have a portion of the cover tape 405 manipulated 407 such that a tape engagement feature or splitter 220 (embodiments of which are shown in FIGS. 5-16) may easily engage cover tape 405 to reliably expose components 12. For example FIGS. 3-4 depict respective side and top views of an embodiment of a manipulated component tape 400 having a portion of a cover tape 405 manipulated 407. A manipulated portion 407 of the cover tape 405 is configured to engage with a cover tape splitter 220 of a component tape feeder 10. The manipulated portion 407 may be a bubble formed by snagging the cover tape 405 and pulling it slightly away from the base tape 404 so as to create the bubble (as shown and described further with respect to FIGS. 17-25). In addition, the manipulated portion 407 may contain a hole 409. Moreover, the manipulated portion 407 of the cover tape 405 may be formed by heating the cover tape 405 such that it pocks or bubbles away from the base tape 404. Still further, chemical means, such as plasticizers may be dabbed on a small portion of cover tape 405 causing the cover tape 405 to form the manipulated portion 407 by warping the cover tape 405 into a raised condition away from base tape 404. Those in the art should appreciate that a portion 407 of the cover tape 405 may be manipulated in manners other than by bubbling. For instance, small tears, seems, rips, or cuts may also partially manipulate the cover tape 405 from the base tape 404, such as hole 409. However, the manipulation of the cover tape 405, such as introduction of a manipulated portion 407 such as a bubble or other like features, should not jeopardize the secure retention of electrical components 12 housed within pockets 406 of component tape 400. The manipulated portion 407 of the cover tape 405 continues to cover the base tape 404 and retain electrical components 12 in the base tape 405 beneath the manipulated portion 407 of cover tape 405. It should further be recognized by those of ordinary skill that a portion 407 of a cover tape 405 of a component tape 400 may be manipulated and partially separated from a base tape 404 by an automated process involving mechanisms designed for such a purpose or may be partially separated by a human worker who manually creates the partial separation by any operable means. Hence, a component tape 405 may be originally fabricated by a supplier such that it comes with a manipulated portion 407 being bubbled or otherwise provided with a partially separated from the cover tape 405. Furthermore, a cover tape 405 may have a portion 407 raised or otherwise partially separated by an operator prior to provision of the component tape 400 to a feeder 10 and/or delivery to a component placement machine. Preparing the component tape 400 for engagement with a tape splitter 220 of a feeder 10 may comprise manipulating a portion 407 of the cover tape 405 so that the cover tape 405 has structure facilitating engagement of the cover tape 405 with the tape splitter 220 of the feeder 10.

With reference to FIG. 17, automated component tape 400 manipulation may be effectuated by a feeder 10. The component tape feeder apparatus 10 may include a first channel 500 such as a conduit component or guide element that may facilitate controlled and directed movement of a component tape, such as component tape 400, from the first input module 100 further into and through the feeder apparatus 10. Moreover, a component tape feeder apparatus 10 may also include a second channel 550 such as a conduit component or guide element providing means to control and direct movement of a component tape, such as component tape 400, from the second input module 150 further into and through the feeder apparatus 10. The channels 500 and 550 may combine into a single channel 600. Moreover, the feeder may include an output module 300. A drive member, such as input module 100, or such as input module 150, may be operable with a tape feeder 10 such that the component tape 400 may be self-threaded, auto-loaded, auto-fed, self-advanced, self-aligned, and/or driven for manipulation by a pre-splitter module 800 without substantial operator enacted manual preparation steps. In other words, an operator may simply place the component tape 400 into interaction with a drive member of the feeder 10 and the feeder 10 may be structured and operable to do the rest. The pre-splitter module 800 may in some manner manipulate the cover tape 405 of the component tape 400 to form the manipulated portion 407 and thereby help facilitate automated operation of the feeder 10 involving reliable and efficient exposure of the electrical components 12 for supply to a component placement machine (not shown). Accordingly, the operator need not manually manipulate the cover tape 405 so that the cover tape 405 can be effectively split, or otherwise removed during feeder 10 operation. Exposing components 12 for supply to a component placement machine may be automatically facilitated by providing a component tape 400 that may be manipulated by a pre-splitter module 800 to form a manipulated portion 407, wherein the manipulated portion 407 of the component tape 400 may be engaged and split by an exposure module 200, thereby exposing the components 12 for extraction by a component placement machine.

Figure 5:
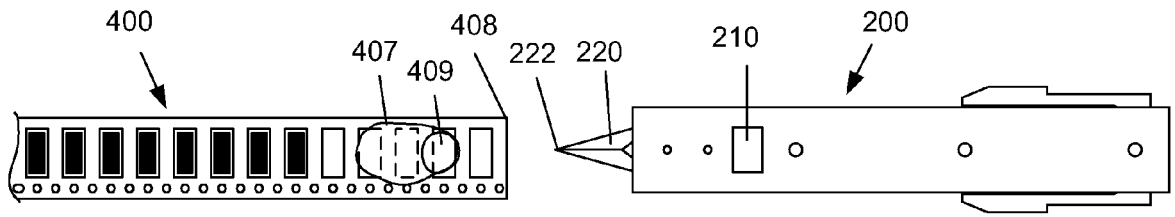
FIG. 5 depicts a top view of an embodiment of a component tape just prior to encounter with an embodiment of an exposure module, in accordance with embodiments of the present invention.
Figure 10:
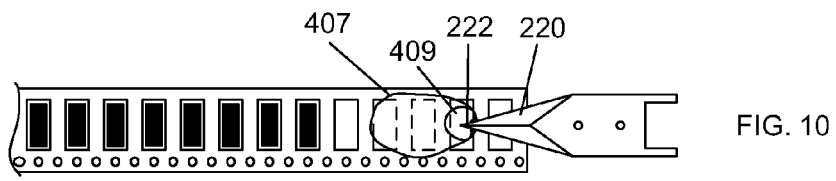
FIG. 10 depicts a top view of an embodiment of a component tape just after a manipulated portion of the cover tape encounters an embodiment of a tape engagement feature of an embodiment of an exposure module, in accordance with embodiments of the present invention.
Figure 11:
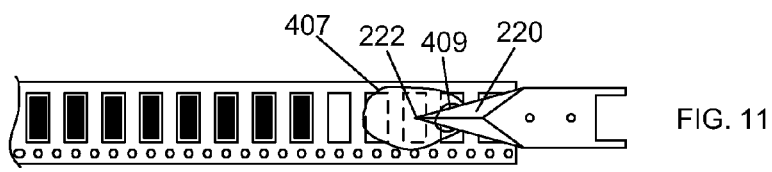
FIG. 11 depicts a top view of an embodiment of a component tape while the manipulated portion of the cover tape encounters an embodiment of a tape engagement feature of an embodiment of an exposure module, in accordance with embodiments of the present invention.
Figure 6:
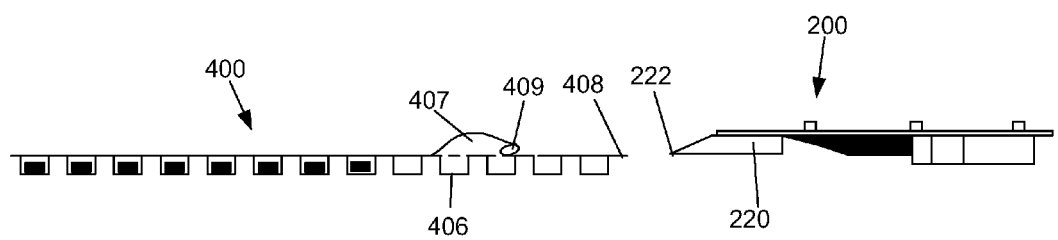
FIG. 6 depicts a side view of an embodiment of a component tape just prior to encounter with an embodiment of an exposure module, in accordance with embodiments of the present invention.
Figure 8:
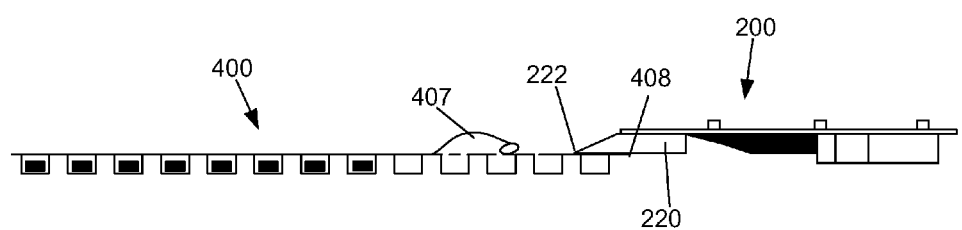
FIG. 8 depicts a side view of an embodiment of a component tape just after encounter with an embodiment of an exposure module, in accordance with embodiments of the present invention.
Figure 7:
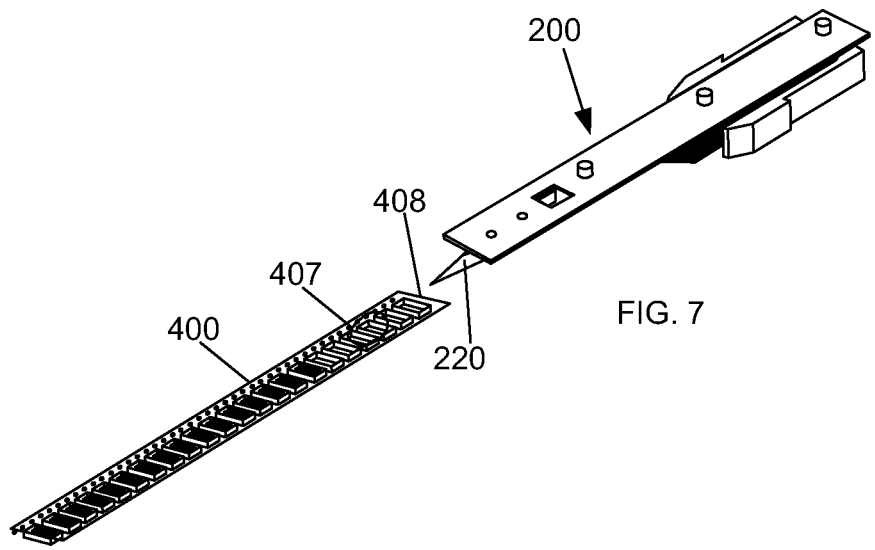
FIG. 7 depicts a perspective view of an embodiment of a component tape just prior to encounter with an embodiment of an exposure module, in accordance with embodiments of the present invention.
Figure 9:
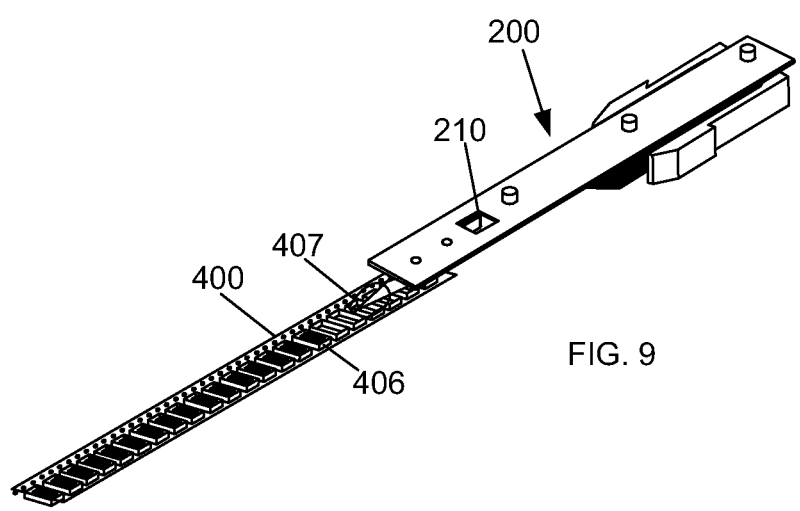
FIG. 9 depicts a perspective view of an embodiment of a component tape just after a manipulated portion of the cover tape encounters an embodiment of a tape engagement feature of an embodiment of an exposure module, in accordance with embodiments of the present invention.

With continued reference to FIG. 17 and additional reference to FIGS. 5-16, the depiction of possible positioning of a component tape 400 including a manipulated portion 407 having a hole 409 before, during, and after interactive engagement with an embodiment of a tape engagement feature or cover tape splitter 220 of an exposure module 200 of feeder 10, as the component tape 400 is advanced is discussed. As depicted in FIG. 5, a component tape 400 may be advanced to a position just prior to encounter with an embodiment of an exposure module 200 of a component tape feeder apparatus 10, wherein the leading edge 408 of the component tape 400 is near tape engagement element 220 of exposure module 200. The component tape 400 may include a manipulated portion 407 in the cover tape 405 such as a bubble having a hole 409. In particular FIGS. 5-7 depict closer views of an embodiment of the component tape 400 just prior to encounter with an embodiment of an exposure module 200, in accordance with embodiments of the present invention. Moreover, as the component tape 400 continues to advance toward the exposure module 200, FIGS. 8-10 depict views of the component tape 400 just after encounter with an embodiment of a tape engagement feature 220 of the exposure module 200. At this moment the tape 400 may be driven by a drive member, such as input module 100 and may reach a point where the tip 222 of the tape engagement feature or cover tape splitter 220 comes into initial contact with a forwardly advancing edge of the upraised manipulated portion 407 containing hole 409 of the cover tape 405. As advancement of the tape 400 continues, the tip 222 begins to enter hole 409 of the manipulated portion 407 as the tape cover tape splitter 220 starts to engage the cover tape 405 (see FIG. 11).

Figure 13:
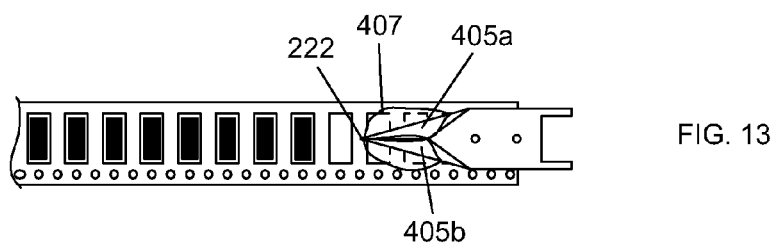
FIG. 13 depicts a top view of an embodiment of a component tape having a manipulated portion of the cover tape splitting while the manipulated portion of the cover tape encounters an embodiment of a tape engagement feature of an embodiment of an exposure module, in accordance with embodiments of the present invention.
Figure 12:
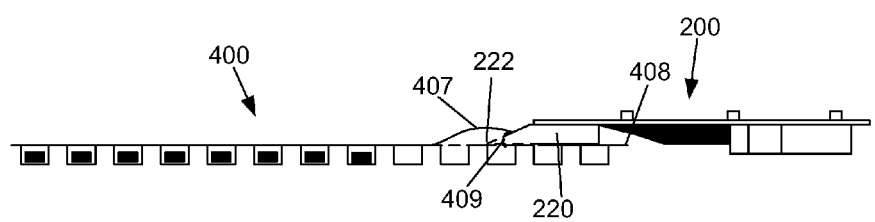
FIG. 12 depicts a side view of an embodiment of a component tape while the manipulated portion of the cover tape encounters an embodiment of a tape engagement feature of an embodiment of an exposure module, in accordance with embodiments of the present invention.
Figure 14:
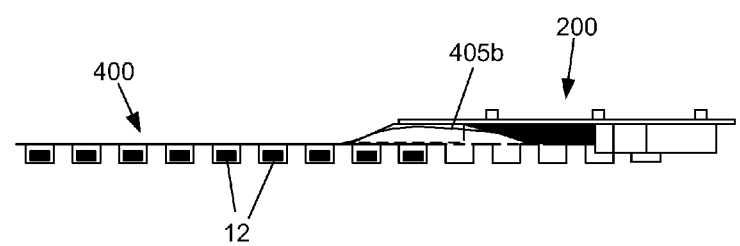
FIG. 14 depicts a side view of an embodiment of a component tape having a manipulated portion of the cover tape splitting as it interacts with a tape engagement feature of an embodiment of an exposure module, in accordance with embodiments of the present invention.

Once the cover tape 405 of component tape 400 has been initially engaged by the tape engagement tip 222 of the tape engagement feature 220, then the structural configuration of the tape engagement feature 220 may facilitate separation and biased deformation of the cover tape 405 as it is advanced past the engaging tape engagement feature 220. For example, as pertaining particularly to the depicted embodiment, the wedge-like shape of the tape engagement feature 220 may cause the cover tape 405 to split around the tape engagement feature 220 during tape advancement. Accordingly, the cover tape 405 may be parsed into two sections 405a and 405b, each section separating on an opposite side of the wedge-like tape engagement feature. Thus, FIGS. 12-14 depict views of an embodiment of a component tape 400 having a cover tape 405 with a manipulated portion 407 while the cover tape 405 encounters an embodiment of a tape engagement feature 220 of an embodiment of an exposure module 200, in accordance with embodiments of the present invention. This interactive encounter of the component tape 400 being forcefully advanced, by a drive member, past the tape engagement feature 220 may cause the cover tape 405 to separate into two pieces 405a and 405b, thereby revealing and exposing the electronic components 12 housed within the component tape 400.

As the component tape 400 advances past exposure module 200, the manipulated portion 407 may begin to reform. Accordingly, FIG. 15 depicts a view of an embodiment of a component tape 400 having a cover tape 405 with a manipulated portion 407 reforming after the manipulated portion 407 encounters an embodiment of the tape engagement feature 220 of an embodiment of an exposure module 200, in accordance with embodiments of the present invention. Moreover, as advancement continues, more exposed electronic components 12 may be picked by component placement machine, and the previously separated sections 405a/b of cover tape 405 can continue to be realigned or reformed into a position proximate the base tape 404. As such, FIG. 16 depicts a top view of an embodiment of a component tape 400 having sections 405a/b rejoined following encounter with an embodiment of a tape engagement feature 220 of an embodiment of an exposure module 200, in accordance with embodiments of the present invention.

Similarly, although, as depicted herein, the cover tape 405 is manipulated in a manner so as to split down the middle, those of ordinary skill should recognize that various manners of cover tape manipulation for component 12 exposure may satisfy the objects of the present invention. Embodiments of a tape engagement feature, such as cover tape splitter 220 may have a different structural configuration and/or may be positioned differently with respect to the advancing component tape 400 so as to engage the tape 400 in a different manner. For example, a tape engagement feature 220 may be formed and positioned to separate a cover tape 405 to one side of component tape 400. As such, the cover tape 405, as removed to one side or component tape 400 may also reform or realign with the base tape 405, following extraction of electronic components 12 housed within the component tape 400. In addition, manipulated portion 407 may not include hole 409. In this situation the tip 222 may pierce the manipulated portion 407 as the tape engagement feature 220 starts to engage the cover tape 405 as opposed to entering hole 409.

As discussed earlier, the manipulated portion 407 of cover tape 405 may occur and exist in a variety of ways. FIG. 17 depicts an embodiment of a feeder 10 facilitating automated manipulation of a cover tape 405 by provision and operation of a pre-splitter or tape manipulation module 800 within feeder 10. Pre-splitter module 800 may be situated contiguous with channel 600 such that as component tape 400 advances along channel 600, module 800 may manipulate a portion 407 of the cover tape 405 of component tape 400. It should be recognized that the cover tape 405 may be advanced in both a forward or a reverse direction with respect to the pre-splitter module 800.

Figure 18:
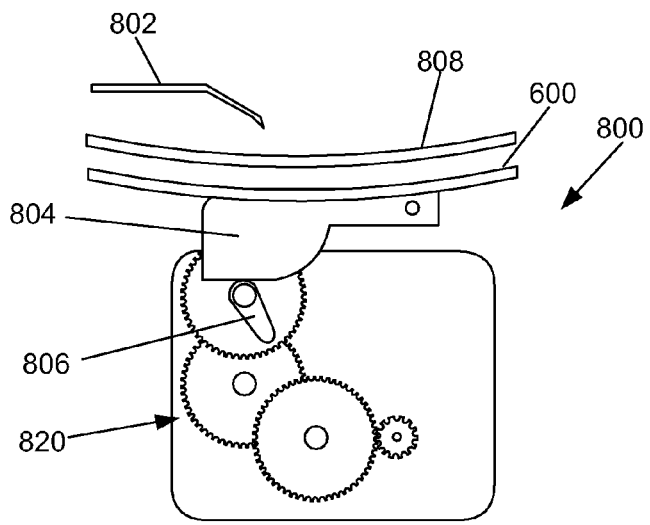
FIG. 18 depicts a side view of an embodiment of a pre-splitter module with a cam-driven rocker in a downward position, in accordance with embodiments of the present invention.
Figure 19:
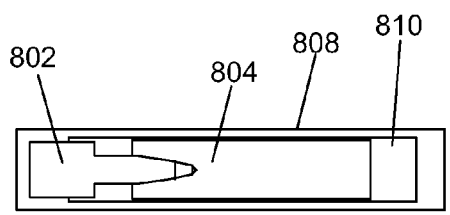
FIG. 19 depicts a top view of an embodiment of a pre-splitter module, in accordance with embodiments of the present invention.
Figure 20:
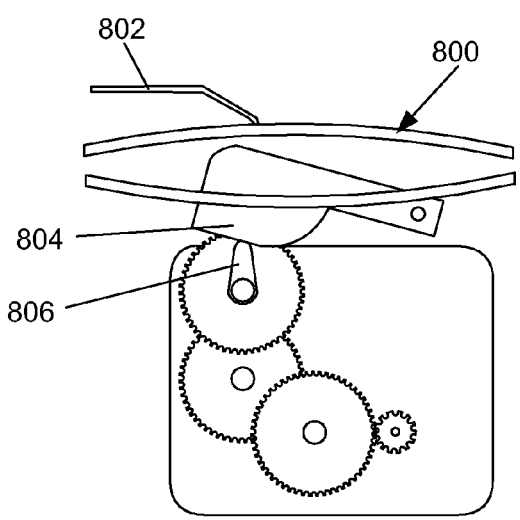
FIG. 20 depicts a side view of an embodiment of a tape pre-splitter module with a cam-driven rocker in an upward position, in accordance with embodiments of the present invention.

Further, FIGS. 18-20 depict views of an embodiment of a pre-splitter module 800. Pre-splitter module 800 may be an apparatus comprising a pre-splitter 802, a cam driven rocker 804 and cam 806. A pre-splitter 802 may be any implement operable to manipulate the cover tape 405. For example, a pre-splitter 802 may have a sharp point, a hook, a mechanical catch, a needle, a heating element, a nozzle configured to deliver a chemical agent, and/or a blade configured to snag or otherwise manipulate the cover tape 405 without substantially affecting the base tape 404 and thereby form a manipulated portion 407. A drive system 820 may drive cam lobe 806, such that when cam lobe 806 is at the top of its rotation, pres-splitter 802 passes through guide 808 through opening 810. Channel 600 may also include an opening for the passage of pres-splitter 802. Accordingly, FIGS. 21-25 depict views of a component tape 400 before, during and after the manipulation of cover tape 405 by pre-splitter module 800 to form a manipulated portion 407. Typically cam-drive rocker 804 will be in a downward position as component tape 400 moves along channel 600. However, when a component tape 400 is being driven through feeder 10 for the first time, or when component tape 400 has been reversed either partially or fully past exposure module 200, the cover tape 405 may need to be manipulated to form the manipulated portion 407. In order to accomplish this, forward movement of component tape 400 may be stopped, then cam lobe 806 rotated such that rocker 804 may push the component tape 400 upwards. At which point pre-splitter 802 enters opening 810 in guide 808 and may pierce cover tape 405, snagging it to manipulate the cover tape 405 and create a manipulated portion 407 such as a bubble. In addition while rocker 804 is in its upward position, component tape 400 may be moved slightly forwards and backwards to reliably create the manipulated portion 407 in cover tape 405 by allowing the snag to loosen a larger manipulated area of the cover tape 405 being separated from the base tape 404 as well as creating hole 409. Once, manipulated portion 407 is created, a cam lobe 806 may be rotated in order to return rocker 804 to its passive downwardly oriented position thereby allowing component tape 400 to continue its forward motion to exposure module 200.

While pre-splitter module 800 is described as being housed within feeder 10, a similar tape manipulation apparatus may be used by an operator away from feeder 10. The operator may insert a component tape 400 into a manipulation apparatus prior to inserting component tape 400 into an input module 100 of feeder 10. The manipulation apparatus may then manipulate the cover tape 405. In this manner, the cover tape 405 may then comprise a manipulated portion 407 for engagement with the tape engagement feature or cover tape splitter 220 of exposure module 200, when the component tape 400 is initially inserted into a feeder apparatus 10.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention.

What is claimed is:

1. A method of preparing a component tape for engagement with a tape splitter of a feeder, the method comprising:
    providing a component tape including:
        a base tape, wherein the base tape includes pockets configured to house electrical components for placement on a printed circuit board; and
        a cover tape, covering the base tape;
    manipulating a portion of the cover tape from above the cover tape to form an upraised manipulated portion of the cover tape that continues to cover the base tape and retain the electrical components in the base tape beneath the upraised manipulated portion of the cover tape, the upraised manipulated portion of the cover tape having structure facilitating initial engagement of the cover tape with the tape splitter of the feeder, wherein the structure of the manipulated portion defined by a vacancy between a top surface of the base tape and the cover tape; and
    after the manipulating the cover tape to form the upraised portion, advancing the component tape towards the tape splitter whereby the upraised manipulated portion of the cover tape contacts the tape splitter to split the cover tape from one section into two sections and expose the electrical components.

2. The method of claim 1, wherein manipulating a portion of the cover tape includes creating a bubble in the cover tape.

3. The method of claim 1, wherein manipulating a portion of the cover tape further includes creating a hole in the cover tape.

4. The method of claim 1, wherein manipulating a portion of the cover tape includes heating the cover tape such that it pocks away from the base tape.

5. The method of claim 1, wherein manipulating a portion of the cover tape includes dabbing a chemical on a small portion of cover tape causing the cover tape to warp into a raised condition away from the base tape.

6. The method of claim 1, wherein manipulating a portion of the cover tape includes actions pertaining to the group consisting of tearing, ripping, snagging, piercing, or cutting the cover tape.

7. A method of providing a component tape to feed electronic components, said method comprising:
    providing a component tape including:
        a base tape, wherein the base tape includes pockets configured to house electrical components for placement on a printed circuit board; and
        a cover tape, covering said base tape;
    manipulating a portion of the cover tape from above the cover tape, with a pre-splitter module through operation of a pre-splitter, to form an upraised manipulated portion of the cover tape that continues to cover the base tape and retain the electrical components in the base tape beneath the upraised manipulated portion of the cover tape, the upraised manipulated portion having a structure defined by a vacancy between the cover tape and a top surface of the base tape; and advancing the component tape towards the tape splitter whereby the upraised manipulated portion of the cover tape contacts with the tape splitter to split the cover tape from one section into two sections and expose the electrical components, as the component tape is driven through the component tape feeder.

8. The method of claim 7, wherein manipulating the cover tape includes creating a bubble in the cover tape.

9. The method of claim 7, wherein manipulating the cover tape further includes creating a hole in the cover tape.

* * * * *